(12) United States Patent
Jiang

(10) Patent No.: US 12,349,467 B2
(45) Date of Patent: Jul. 1, 2025

(54) ARRAY SUBSTRATE AND DISPLAY PANEL

(71) Applicant: GUANGZHOU CHINA STAR OPTOELECTRONICS SEMICONDUCTOR DISPLAY TECHNOLOGY CO., LTD., Guangdong (CN)

(72) Inventor: Zhixiong Jiang, Guangdong (CN)

(73) Assignee: GUANGZHOU CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/905,258

(22) PCT Filed: Aug. 12, 2022

(86) PCT No.: PCT/CN2022/112134
§ 371 (c)(1),
(2) Date: Aug. 29, 2022

(87) PCT Pub. No.: WO2024/021178
PCT Pub. Date: Feb. 1, 2024

(65) Prior Publication Data
US 2024/0222394 A1    Jul. 4, 2024

(30) Foreign Application Priority Data
Jul. 29, 2022   (CN) .......................... 202210906592.8

(51) Int. Cl.
*H01L 27/12*    (2006.01)
*H10D 86/40*    (2025.01)
*H10D 86/60*    (2025.01)

(52) U.S. Cl.
CPC .......... *H10D 86/60* (2025.01); *H10D 86/451* (2025.01); *H10D 86/421* (2025.01)

(58) Field of Classification Search
CPC ............. H01L 27/1248; H01L 27/1222; H01L 27/1225; H10D 86/60; H10D 86/451; H10D 86/421; H10D 86/423
See application file for complete search history.

(56) References Cited

U.S. PATENT DOCUMENTS

| | | | |
|---|---|---|---|
| 2008/0164477 A1 | 7/2008 | Choi | |
| 2014/0332761 A1* | 11/2014 | Kim | G03F 1/00 430/5 |
| 2015/0069348 A1* | 3/2015 | Tae | H10K 59/1213 430/5 |

FOREIGN PATENT DOCUMENTS

| | | |
|---|---|---|
| CN | 1841781 A | 10/2006 |
| CN | 102365740 A | 2/2012 |

(Continued)

OTHER PUBLICATIONS

International Search Report in International application No. PCT/CN2022/112134, mailed on Dec. 20, 2022.

(Continued)

*Primary Examiner* — Mohammed R Alam
(74) *Attorney, Agent, or Firm* — PV IP PC; Wei Te Chung

(57) ABSTRACT

The present disclosure provides an array substrate and a display panel. According to the present disclosure, angles between two side walls of a first sub-active part and a first bottom surface of a side of the first sub-active part close to a second active part are both acute angles, thereby reducing an angle of a corner experienced by a signal transmitted from a first electrode to a second electrode via an active layer. Therefore, a current distribution is optimized, a resistance at the corner is reduced, and the generated heat is (Continued)

reduced under the condition that the current is not changed, thereby improving service life of the display panel and reliability of the display panel.

17 Claims, 5 Drawing Sheets

(56) References Cited

FOREIGN PATENT DOCUMENTS

| | | |
|---|---|---|
| CN | 106098563 A | 11/2016 |
| CN | 107425076 A | 12/2017 |
| JP | 10270699 A | 10/1998 |

OTHER PUBLICATIONS

Written Opinion of the International Search Authority in International application No. PCT/CN2022/112134, mailed on Dec. 20, 2022.

* cited by examiner

ARRAY SUBSTRATE AND DISPLAY PANEL

TECHNICAL FIELD

The present disclosure relates to a display technology field, and more particularly to an array substrate and a display panel.

BACKGROUND

Currently, a thin film transistor (TFT) is an important component of a display panel, and can be formed on a glass substrate or a plastic substrate.

Technical Problems

As shown in FIG. 1, in a top view of a conventional thin film transistor 200, a first electrode 201 and a second electrode 202 are parallel to each other, and an active layer 203 is orthogonal to the first electrode 201. That is, an angle $\alpha 1$ defined between the active layer 203 and the first electrode 201 is 90°, and an angle $\alpha 2$ defined between the active layer 203 and the second electrode 202 is 90°. In this case, during a process in which a signal is transmitted from the first electrode 201 to the second electrode 202 via the active layer 203, for example, from the upper right corner of the first electrode to the lower left corner of the second electrode in FIG. 1, the signal undergoes two corners, one of which has an angle of $180°+\alpha_1=270°$ and the other of which has an angle of $180°+\alpha_2=270°$. When the thin film transistor 200 is turned on, charge accumulation occurs at the two corners, resulting in a larger resistance at the corners. It can be known from a formula $Q=I^2Rt$, that the larger the resistance R is, the larger the generated heat Q is, and the easier the thin film transistor 200 is burned, where, Q represents the generated heat with a unit of Joule (J), I represents the current with a unit of ampere (A), R represents resistance with a unit of ohm (Ω), and t represents time with a unit of second (s). TECHNICAL SOLUTIONS TO THE PROBLEM An object of the present disclosure is to provide an array substrate and a display panel, which can solve a problem that the conventional thin film transistor is easy to be burned due to a larger resistance at the corners when the charge accumulation occurs at the corners in the conventional thin film transistor.

In order to solve the above problem, the present disclosure provides an array substrate, including a substrate; an active layer disposed on the substrate and including a first active part and second and third active parts connected to opposite ends of the first active part, respectively; a first electrode covering the second active part and electrically connected to the second active part; and a second electrode covering the third active part and electrically connected to the third active part; wherein an orthographic projection of the first active part on the substrate is located between an orthographic projection of the first electrode on the substrate and an orthographic projection of the second electrode on the substrate; the first active part includes a first sub-active part and a second sub-active part, wherein the first sub-active part is connected between the second active part and the second sub-active part, the second sub-active part is connected between the first sub-active part and the third active part; and angles between two side walls of the first sub-active part and a first bottom surface of a side of the first sub-active part close to the second active part are both acute angles.

Further, angles between two side walls of the second sub-active part and a third bottom surface of a side of the second sub-active part close to the third active part are both acute angles.

Further, a width of the first bottom surface of the first sub-active part is greater than a width of a second bottom surface of a side of the first sub-active part away from the second active part; and a width of the third bottom surface of the second sub-active part is greater than a width of a fourth bottom surface of a side of the second sub-active part away from the third active part.

Further, a pitch between the first bottom surface and the second bottom surface of the first sub-active part is less than or equal to one half of a pitch between the first electrode and the second electrode, and the pitch between the first bottom surface and the second bottom surface of the first sub-active part is greater than or equal to one tenth of the pitch between the first electrode and the second electrode; a pitch between the third bottom surface and the fourth bottom surface of the second sub-active part is less than or equal to one half of the pitch between the first electrode and the second electrode, and the pitch between the third bottom surface and the fourth bottom surface of the second sub-active part is greater than or equal to one tenth of the pitch between the first electrode and the second electrode.

Further, the maximum distance between the side wall of the first sub-active part and the side wall of the second active part on the same side is greater than or equal to a pitch between the first bottom surface and the second bottom surface of the first sub-active part; and the maximum distance between the side wall of the second sub-active part and the side wall of the third active part on the same side is greater than or equal to a pitch between the third bottom surface and the fourth bottom surface of the second sub-active part.

Further, the first active part further includes a third sub-active part connected between the first sub-active part and the second sub-active part.

Further, a pitch between a fifth bottom surface of a side of the third sub-active part close to the first sub-active part and a sixth bottom surface of a side of the third sub-active part away from the first sub-active part is greater than or equal to 1 um.

Further, a pitch between the fifth bottom surface of the third sub-active part and the sixth bottom surface of the third sub-active part is greater than or equal to the pitch between the first bottom surface and the second bottom surface of the first sub-active part; and the pitch between the fifth bottom surface of the third sub-active part and the sixth bottom surface of the third sub-active part is greater than or equal to the pitch between the third bottom surface of the second sub-active part and the fourth bottom surface of the second sub-active part.

Further, shapes of the orthographic projections of sidewalls of the first sub-active part on the substrate include one or more of a straight line and an arc line; and shapes of the orthographic projections of sidewalls of the second sub-active part on the substrate include one or more of the straight lines and the arc line.

In order to solve the above problem, the present disclosure further provides a display panel including the array substrate of the present disclosure.

BENEFICIAL EFFECTS

According to the present disclosure, the angles between the two side walls of the first sub-active part and the first bottom surface of the side of the first sub-active part close to the second active part are acute angles, thereby reducing the angles of the corners experienced by the signal transmitted from the first electrode to the second electrode via the active layer. Therefore, a current distribution is optimized, and charge transmission is smoother, thereby reducing the crowding and aggregation effect of the charge at the corners. Moreover, a resistance at the corner is reduced, and the generated heat is reduced under the condition that the current is not changed, so that the probability of burning the thin film transistor is reduced, finally improving service life of the display panel and reliability of the display panel.

BRIEF DESCRIPTION OF THE DRAWINGS

In order to more clearly illustrate the technical solutions in embodiments of the present disclosure, the accompanying drawings depicted in the description of the embodiments will be briefly described below. It will be apparent that the accompanying drawings in the following description are merely some embodiments of the present disclosure, and other drawings may be obtained from these drawings without creative effort by those skilled in the art.

Figure 1:
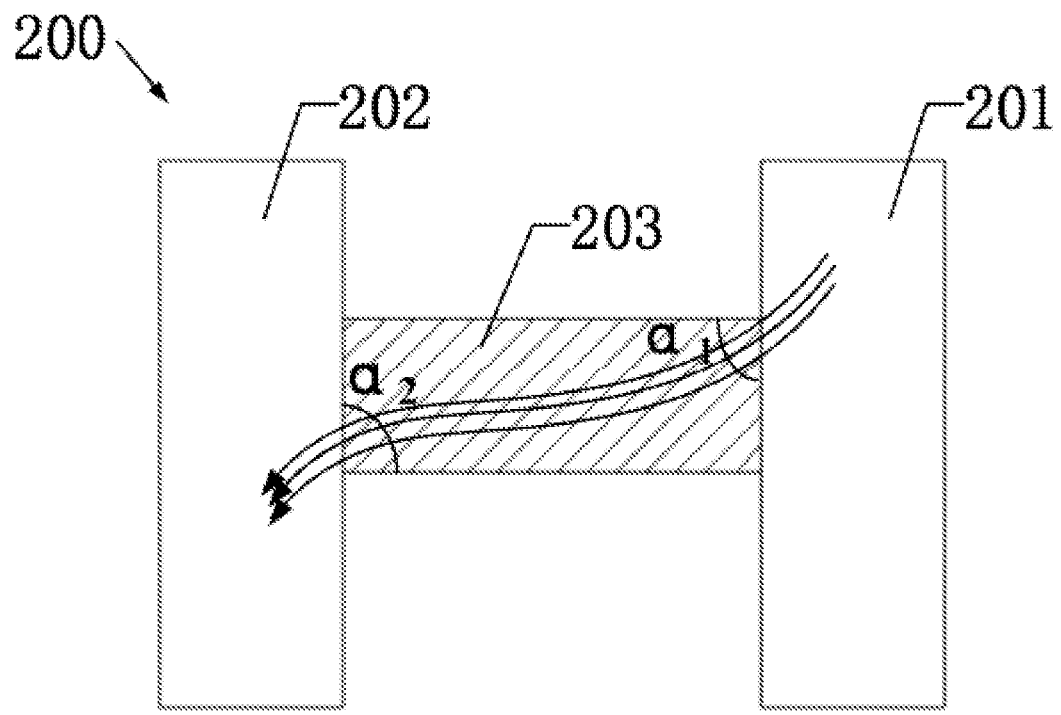
FIG. 1 is a top view of a conventional thin film transistor.

| Reference numerals: | |
|---|---|
| 100. array substrate; | |
| 1. substrate; | 2. gate; |
| 3. gate insulation layer; | 4. active layer; |
| 5. first electrode; | 6. second electrode; |
| 41. first active layer; | 42. second active layer; |
| 43. third active layer; | |
| 411. first sub-active layer; | 412. second sub-active layer; |
| 413. third sub-active layer; | |
| 4111. first bottom surface; | 4112. second bottom surface; |
| 4121. third bottom surface; | 4122. fourth bottom surface; |
| 4131. fifth bottom surface; | 4132. sixth bottom surface. |

EMBODIMENTS OF THE PRESENT DISCLOSURE

The preferred embodiments of the present disclosure are described in detail following with reference to the accompanying drawings to fully introduce the summary of the present disclosure for those skilled in the art so as to certify the present disclosure can be implemented and render the disclosed technical content of the present disclosure clearer. Those skilled in the art will more readily understand how to implement the disclosure. However, the present disclosure may be embodied in different forms of embodiments, and the scope of the present disclosure is not limited to the embodiments described herein. The following description of the embodiments is not intended to limit the scope of the present disclosure.

The directional terms mentioned in the present disclosure, such as "upper", "lower", "front", "rear", "left", "right", "inside", "outside", "side", etc., only represent the directions in the drawings. The directional terms used herein are used to explain and illustrate the present disclosure and are not intended to limit the scope of the present disclosure.

In the drawings, structurally identical components are denoted by the same reference numerals, and structural or functionally similar components are denoted by similar reference numerals. Moreover, the size and thickness of each component shown in the drawings are arbitrarily shown for ease of understanding and description, and the present disclosure does not limit the size and thickness of each component.

EMBODIMENT 1

The embodiment provides a display panel, including one of a liquid crystal display panel (referred to as LCD) and an organic electroluminescent display panel (referred to as OLED). The display panel includes an array substrate 100.

Figure 2:
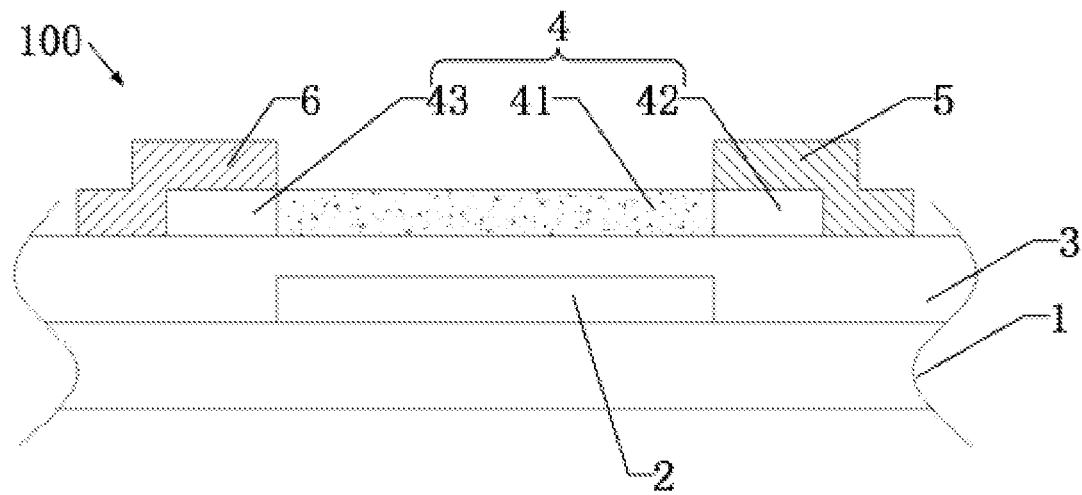
FIG. 2 is a schematic structural view of an array substrate of the present disclosure.

As shown in FIG. 2, the array substrate 100 includes a substrate 1, a gate 2, a gate insulation layer 3, an active layer 4, a first electrode 5, and a second electrode 6.

The substrate 1 is one or more of glass, polyimide, polycarbonate, polyethylene terephthalate, and polyethylene naphthalate. In the embodiment, the substrate 1 has a single-layer structure. In other embodiments, the substrate 1 may include two oppositely disposed substrate layers and a barrier layer disposed between the two substrates, thereby enhancing the strength of the substrate 1 using the two substrate layers and utilizing the barrier/blocking layer to enhance the performance of the substrate 1 to block water and oxygen intrusion.

The gate 2 is disposed on the substrate 1. The material of the gate 2 may be Mo, a combination of Mo and Al, a combination of Mo and Cu, a combination of Mo, Cu and IZO, a combination of IZO, Cu and IZO, a combination of Mo, Cu and ITO, a combination of Ni, Cu and Ni, a combination of NiCr, Cu and NiCr, CuNb, or the like. In the embodiment, the material of the gate 2 is Cu.

The gate insulation layer 3 is disposed on a side of the gate 2 away from the substrate 1, and extends on the substrate 1 to cover the substrate 1. The gate insulation layer 3 is mainly configured to prevent a short circuit phenomenon from occurring between the gate 2 and the active layer 4. The material of the gate insulation layer 3 may be SiOx, SiNx, $Al_2O_3$, a combination of SiNx and SiOx, a combination of SiOx, SiNx and SiOx, or the like. In the embodiment, the material of the gate insulation layer 3 is SiOx.

The gate insulation layer 4 is disposed on a side of the gate insulation layer 3 away from the substrate 1. The material of the active layer 4 is a metal oxide. Since Indium Gallium Zinc Oxide (IGZO) is an amorphous oxide containing indium, gallium and zinc that has a high mobility and the carrier mobility thereof is 20~30 times higher than that of amorphous silicon, charging and discharging rate of the TFT to a pixel electrode can be greatly improved. The IGZO has a high on-state current and a low off-state current, so the active layer can be quickly switched and prevented from electric leakage. A response speed of a pixel is improved, a refresh rate is faster, and a row scanning rate of the pixel is also greatly improved, so that an ultra-high resolution is possible in the display panel. Therefore, in the embodiment, the material of the active layer 4 is the IGZO. In other embodiments, the material of the active layer 4 may be amorphous silicon, low-temperature polycrystalline silicon, or the like.

As shown in FIG. 2, the active layer 4 includes a first active part 41, a second active part 42, and a third active part 43. The second active part 42 and the third active part 43 are connected to opposite ends of the first active part 41, respectively.

The first electrode 5 and the second electrode 6 are one of a source and a drain, respectively. In the embodiment, the first electrode 5 is the source and the second electrode 6 is the drain. In other embodiments, the first electrode 5 may be the drain and the second electrode 6 may be the source.

The first electrode 5 covers the second active part 42 and is electrically connected to the second active part 42. The material of the first electrode 5 may be Mo, a combination of Mo and Al, a combination of Mo and Cu, a combination of Mo, Cu and IZO, a combination of IZO, Cu and IZO, a combination of Mo, Cu and ITO, a combination of Ni, Cu and Ni, a combination of NiCr, Cu and NiCr, CuNb, or the like. In the embodiment, the material of the first electrode 5 is Cu.

The second electrode 6 covers the third active part 43 and is electrically connected to the third active part 43. The material of the second electrode 6 may be Mo, a combination of Mo and Al, a combination of Mo and Cu, a combination of Mo, Cu and IZO, a combination of IZO, Cu and IZO, a combination of Mo, Cu and ITO, a combination of Ni, Cu and Ni, a combination of NiCr, Cu and NiCr, CuNb, or the like. In the embodiment, the material of the second electrode 6 is Cu.

Figure 3:
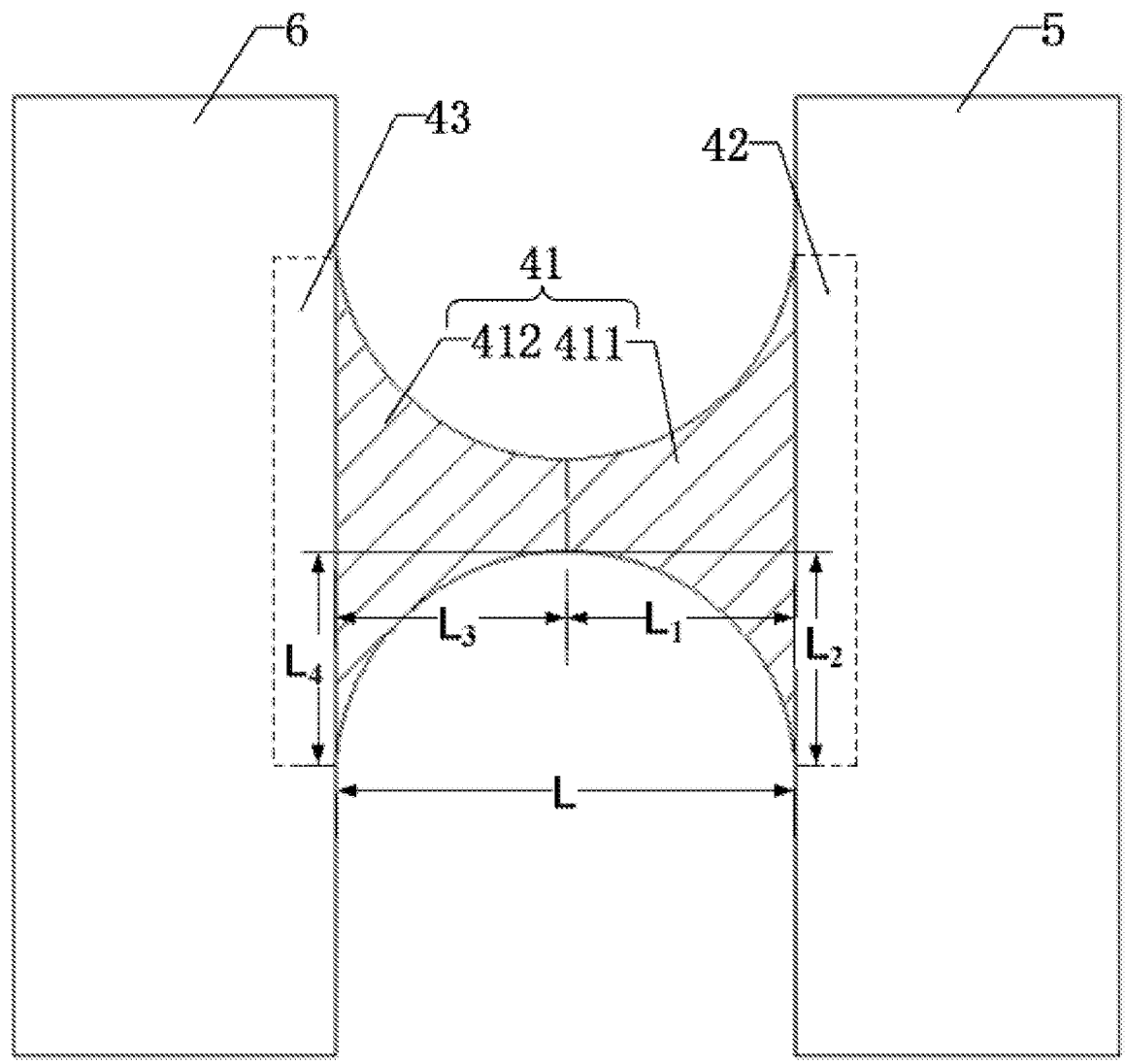
FIG. 3 is a top view of an active layer, a first electrode, and a second electrode of an array substrate according to a first embodiment of the present disclosure.

As shown in FIGS. 2 and 3, an orthographic projection of the first active part 41 on the substrate 1 is located between an orthographic projection of the first electrode 5 on the substrate 1 and an orthographic projection of the second electrode 6 on the substrate 1. In other words, the first electrode 5 and the second electrode 6 are not covered on the first active part 41.

Figure 4:
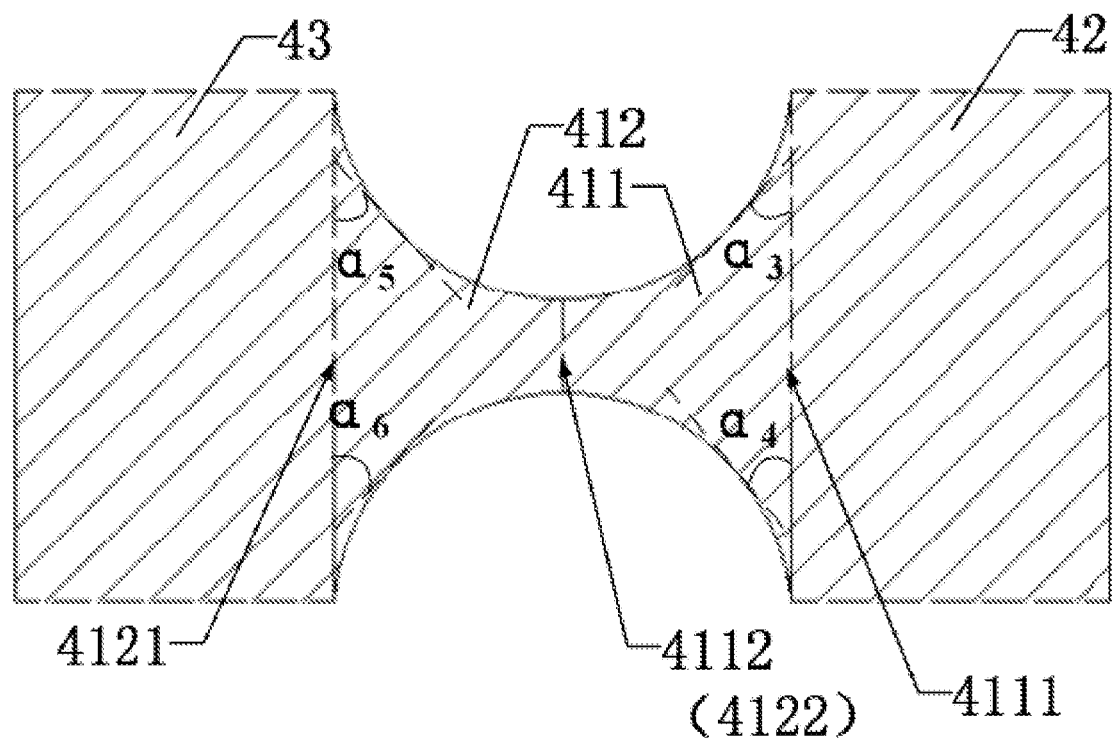
FIG. 4 is a top view of an active layer of an array substrate according to the first embodiment of the present disclosure.

As shown in FIGS. 3 and 4, the first active part 41 includes a first sub-active part 411 and a second sub-active part 412.

The first sub-active part 411 is connected between the second active part 42 and the second sub-active part 412. A bottom surface of a side of the first sub-active part 411 close to the second active part 42 is a first bottom surface 4111, and a bottom surface of a side of the first sub-active part 411 away from the second active part 42 is a second bottom surface 4112.

Shapes of the orthographic projections of sidewalls of the first sub-active part 411 on the substrate 1 include one or more of a straight line and an arc line. In the embodiment, the shapes of the orthographic projections of the two sidewalls of the first sub-active part 411 on the substrate 1 are both the arc lines.

The second sub-active part 412 is connected between the third active part 43 and the first sub-active part 411. A bottom surface of a side of the second sub-active part 412 close to the third active part 43 is a third bottom surface 4121, and a bottom surface of a side of the second sub-active part 412 away from the third active part 43 is a fourth bottom surface 4122. In the embodiment, the fourth bottom surface 4122 completely coincides with the second bottom surface 4112.

Shape of the orthographic projections of sidewalls of the second sub-active part 412 on the substrate 1 include one or more of the straight line and the arc line. In the embodiment, the shapes of the orthographic projections of the two sidewalls of the second sub-active part 412 on the substrate 1 are the arc lines.

Further, angles between the two side walls of the first sub-active part 411 and the first bottom surface 4111 are both acute angles. A width of the first bottom surface 4111 of the first sub-active part 411 is greater than a width of the second bottom surface 4112 of the first sub-active part 411. In the embodiment, the shapes of the orthographic projections of the two sidewalls of the first sub-active part 411 on the substrate 1 are both the arc lines. Specifically, an angle $\alpha_3$ between a tangent of any point of one side wall of the first sub-active part 411 other than end points of the side wall and the first bottom surface 4111 is an acute angle. An angle $\alpha_4$ between a tangent of any point of the other side wall of the first sub-active part 411 other than end points of the other side wall and the first bottom surface 4111 is an acute angle. In this way, A signal passes through a corner of $180°+\alpha_3$ or $180°+\alpha_4$ in the process of flowing the signal from the first electrode 5 to the active layer 4. Since $\alpha_3$ and $\alpha_4$ are acute angles, $180°+\alpha_3$ is less than $270°$ and $180°+\alpha_4$ is less than $270°$. As a result, the angles of the corner experienced by the signal transmitted from the first electrode 5 to the second electrode 6 via the active layer 4 is reduced. Therefore, a current distribution is optimized, and charge transmission is smoother, thereby reducing the crowding and aggregation effect of the charge at the corners. Moreover, a resistance at the corners is reduced, and the generated heat is reduced under the condition that the current is not changed, so that the probability of burning the thin film transistor is reduced, finally improving service life of the display panel and reliability of the display panel.

The width of the first bottom surface 4111 refers to a length of the orthographic projection of the first bottom surface 4111 on the substrate 1. The width of the second bottom surface 4112 refers to a length of the orthographic projection of the second bottom surface 4112 on the substrate 1.

In the embodiment, angles between the two side walls of the second sub-active part 412 and the third bottom surface 4121 are both the acute angles. A width of the third bottom surface 4121 of the second sub-active part 412 is greater than a width of the fourth bottom surface 4122 of the second sub-active part 412. In the embodiment, the shapes of the orthographic projections of the two sidewalls of the second sub-active part 412 on the substrate 1 are both the arc lines. Specifically, an angle $\alpha_5$ between a tangent of any point of one side wall of the second sub-active part 412 other than end points of the side wall and the third bottom surface 4121 is an acute angle. An angle $\alpha_6$ between a tangent of any point of the other side wall of the second sub-active part 412 other than end points of the other side wall and the third bottom surface 4121 is an acute angle. In this way, a signal passes through a corner of $180°+\alpha_5$ or $180°+\alpha_6$ in the process of flowing the signal from the first electrode 5 to the second electrode 6 through the active layer 4. Since $\alpha_5$ and $\alpha_6$ are acute angles, $180°+\alpha_5$ is less than $270°$ and $180°+\alpha_6$ is less than $270°$. As a result, the angle of the corner experienced by the signal transmitted from the first electrode 5 to the second electrode 6 via the active layer 4 is further reduced. Therefore, a current distribution is optimized, and charge transmission is smoother, thereby reducing the crowding and aggregation effect of the charge at the corner. Moreover, a resistance at the corner is reduced, and the generated heat is reduced under the condition that the current is not changed, so that the probability of burning the thin film transistor is reduced, finally improving service life of the display panel and reliability of the display panel.

The width of the third bottom surface 4121 refers to a length of the orthographic projection of the third bottom surface 4121 on the substrate 1. The width of the fourth bottom surface 4122 refers to a length of the orthographic projection of the fourth bottom surface 4122 on the substrate 1.

As shown in FIG. 3, a pitch $L_1$ between the first bottom surface 4111 and the second bottom surface 4112 of the first sub-active part 411 is less than or equal to one half of a pitch L between the first electrode 5 and the second electrode 6, and the pitch $L_1$ between the first bottom surface 4111 and the second bottom surface 4112 of the first sub-active part 411 is greater than or equal to one tenth of the pitch L between the first electrode 5 and the second electrode 6. In the embodiment, the pitch $L_1$ between the first bottom surface 4111 and the second bottom surface 4112 of the first sub-active part 411 is equal to one half of the pitch L between the first electrode 5 and the second electrode 6.

The maximum distance L2 between the side wall of the first sub-active part 411 and the side wall of the second active part 412 on the same side is greater than or equal to the pitch $L_1$ between the first bottom surface 4111 and the second bottom surface 4112 of the first sub-active part 411. In the embodiment, the maximum distance $L_2$ between the side wall of the first sub-active part 411 and the side wall of the second active part 412 on the same side is equal to the pitch $L_1$ between the first bottom surface 4111 and the second bottom surface 4112 of the first sub-active part 411. Therefore, a current distribution can be optimized, and charge transmission is smoother, thereby reducing the crowding and aggregation effect of the charge at the corner.

A pitch $L_3$ between the third bottom surface 4121 and the fourth bottom surface 4122 of the second sub-active part 412 is less than or equal to one half of the pitch L between the first electrode 5 and the second electrode 6, and the pitch $L_3$ between the third bottom surface 4121 and the fourth bottom surface 4122 of the second sub-active part 412 is greater than or equal to one tenth of the pitch L between the first electrode 5 and the second electrode 6. In the embodiment, the pitch $L_3$ between the third bottom surface 4121 and the fourth bottom surface 4122 of the second sub-active part 412 is equal to one half of the pitch L between the first electrode 5 and the second electrode 6.

The maximum distance $L_4$ between the side wall of the second sub-active part 412 and the side wall of the third active part 43 on the same side is greater than or equal to the pitch $L_3$ between the third bottom surface 4121 and the fourth bottom surface 4122 of the second sub-active part 412. In the embodiment, the maximum distance $L_4$ between the side wall of the second sub-active part 412 and the side wall of the third active part 43 on the same side is equal to the pitch $L_3$ between the third bottom surface 4121 and the fourth bottom surface 4122 of the second sub-active part 412. Therefore, a current distribution can be optimized, and the charge transmission is smoother, thereby reducing the crowding and aggregation effect of the charge at the corner.

EMBODIMENT 2

Figure 5:
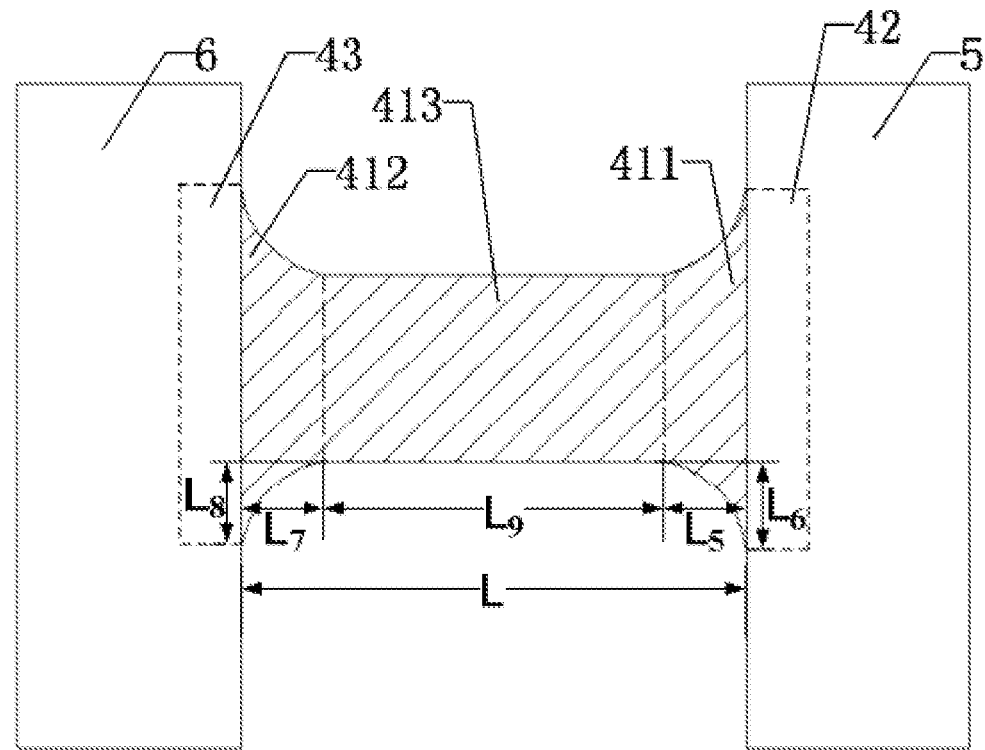
FIG. 5 is a top view of an active layer, a first electrode, and a second electrode of an array substrate according to a second embodiment of the present disclosure.
Figure 6:
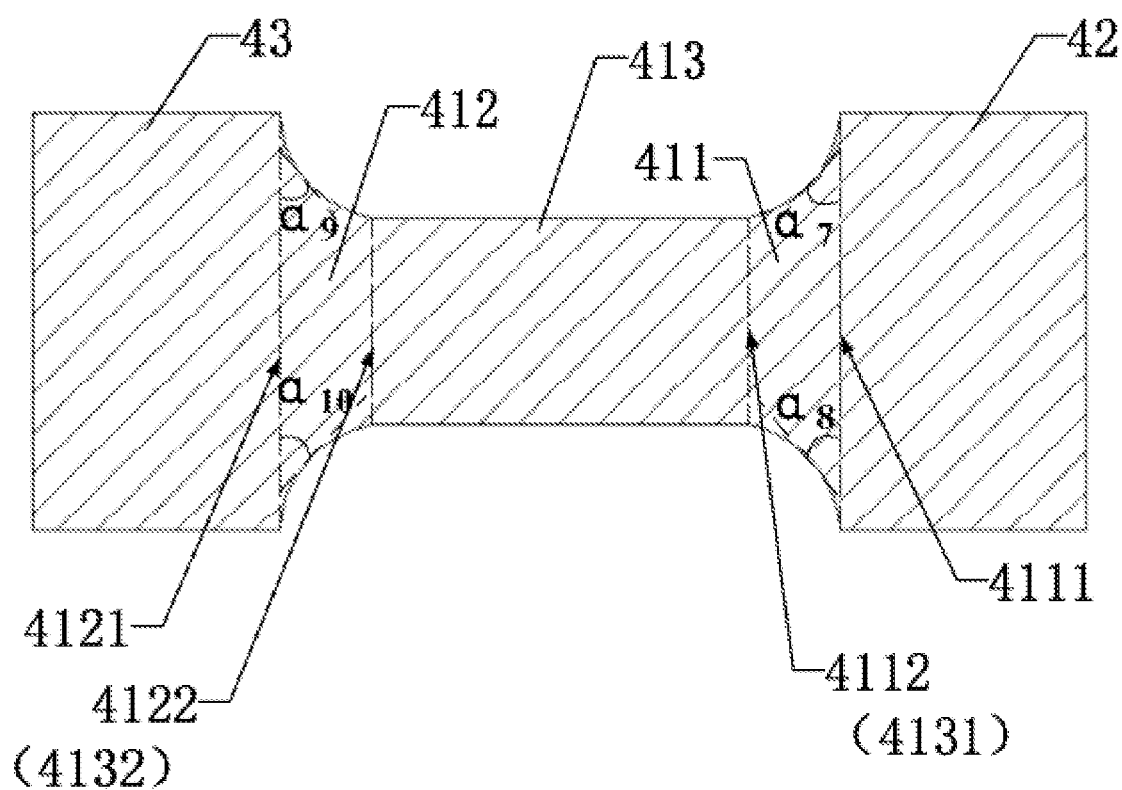
FIG. 6 is a top view of an active layer of an array substrate according to the second embodiment of the present disclosure.

As shown in FIGS. 5 and 6, the present embodiment includes most of the technical features of the first embodiment. The present embodiment differs from the first embodiment in that the first active part 41 in the present embodiment further includes a third sub-active part 413 connected between the first sub-active part 411 and the second sub-active part 412.

A bottom surface of a side of the third sub-active part 413 close to the first sub-active part 411 is a fifth bottom surface 4131, and a bottom surface of a side of the third sub-active part 413 away from the first sub-active part 411 is a sixth bottom surface 4132.

A width of the fifth bottom surface 4131 of the third sub-active part 413 is equal to a width of the second bottom surface 4112 of the first sub-active part 411. In the embodiment, the fifth bottom surface 4131 completely coincides with the second bottom surface 4112. The width of the fifth bottom surface 4131 refers to a length of the orthographic projection of the fifth bottom surface 4131 on the substrate 1.

A width of the sixth bottom surface 4132 of the third sub-active part 413 is equal to a width of the fourth bottom surface 4122 of the second sub-active part 412. In the embodiment, the sixth bottom surface 4132 completely coincides with the fourth bottom surface 4122. The width of the sixth bottom surface 4132 refers to a length of the orthographic projection of the sixth bottom surface 4132 on the substrate 1.

A distance $L_9$ between the fifth bottom surface 4131 and the sixth bottom surface 4132 of the third sub-active part 413 is greater than or equal to 1 μm. In the embodiment, the distance $L_9$ between the fifth bottom surface 4131 and the sixth bottom surface 4132 of the third sub-active part 413 is greater than or equal to 1.5 μm.

The distance $L_9$ between the fifth bottom surface 4131 and the sixth bottom surface 4132 of the third sub-active part 413 is greater than or equal to the pitch $L_5$ between the first bottom surface 4111 and the second bottom surface 4112 of the first sub-active part 411. In the embodiment, the distance $L_9$ between the fifth bottom surface 4131 and the sixth bottom surface 4132 of the third sub-active part 413 is greater than the pitch $L_5$ between the first bottom surface 4111 and the second bottom surface 4112 of the first sub-active part 411.

The distance $L_9$ between the fifth bottom surface 4131 and the sixth bottom surface 4132 of the third sub-active part 413 is greater than or equal to the pitch $L_7$ between the third bottom surface 4121 and the sixth bottom surface 4122 of the second sub-active part 412. In the embodiment, the distance $L_9$ between the fifth bottom surface 4131 and the sixth bottom surface 4132 of the third sub-active part 413 is greater than the pitch $L_7$ between the third bottom surface 4121 and the sixth bottom surface 4122 of the second sub-active part 412.

Angles $\alpha_7$ and as between the two sidewalls of the first sub-active part 411 and the first bottom surface 4111 are both acute angles, and the width of the first bottom surface 4111 of the first sub-active part 411 is larger than the width of the second bottom surface 4112 of the first sub-active part 411. In the embodiment, the shapes of the orthographic projections of the two sidewalls of the first sub-active part 411 on the substrate 1 are both the arc lines. Specifically, an angle $\alpha_7$ between a tangent of any point of one side wall of the first sub-active part 411 other than end points of the side wall and the first bottom surface 4111 is an acute angle. An angle $\alpha_8$ between a tangent of any point of the other side wall of the first sub-active part 411 other than end points of the other side wall and the first bottom surface 4111 is an acute angle. In this way, A signal passes through a corner of 180°+$\alpha_7$ or 180°+$\alpha_8$ in the process of flowing the signal from the first electrode 5 to the active layer 4. Since $\alpha_7$ and $\alpha_8$ are both acute angles, $180°+\alpha_7$ is less than 270° and $180°+\alpha_8$ is less than 270°. As a result, the angle of the corner experienced by the signal transmitted from the first electrode 5 to the second electrode 6 via the active layer 4 is reduced. Therefore, a current distribution is optimized, and the charge transmission is smoother, thereby reducing the crowding and aggregation effect of the charge at the corner. Moreover, the resistance at the corner is reduced, and the generated heat is reduced under the condition that the current is not changed, so that the probability of burning of the thin film transistor is reduced, finally improving the service life of the display panel and the reliability of the display panel.

Angles between the two side walls of the second sub-active part 412 and the third bottom surface 4121 are both acute angles. A width of the third bottom surface 4121 of the second sub-active part 412 is greater than a width of the fourth bottom surface 4122 of the second sub-active part 412. In the embodiment, the shapes of the orthographic projections of the two sidewalls of the second sub-active part 412 on the substrate 1 are both the arc lines. Specifically, an angle $\alpha_9$ between a tangent of any point of one side wall of the second sub-active part 412 other than end points of the side wall and the third bottom surface 4121 is an acute angle. An angle $\alpha_{10}$ between a tangent of any point of the other side wall of the second sub-active part 412 other than end points of the other side wall and the third bottom surface 4121 is an acute angle. In this way, a signal passes through a corner of $180°+\alpha_9$ or $180°+\alpha_{10}$ in the process of flowing the signal from the first electrode 5 to the second electrode 6 through the active layer 4. Since $\alpha_9$ and $\alpha 10$ are both acute angles, $180°+\alpha_9$ is less than 270° and $180°+\alpha_{10}$ is less than 270°. As a result, the angle of the corner experienced by the signal transmitted from the first electrode 5 to the second electrode 6 via the active layer 4 is further reduced. Therefore, a current distribution is optimized, and charge transmission is smoother, thereby reducing the crowding and aggregation effect of the charge at the corner. Moreover, a resistance at the corner is reduced, and the generated heat is reduced under the condition that the current is not changed, so that the probability of burning the thin film transistor is reduced, finally improving service life of the display panel and reliability of the display panel.

The pitch $L_5$ between the first bottom surface 4111 and the second bottom surface 4112 of the first sub-active part 411 is less than or equal to one half of a pitch L (i.e., $L_1+L_3+L_5$) between the first electrode 5 and the second electrode 6, and the pitch $L_5$ between the first bottom surface 4111 and the second bottom surface 4112 of the first sub-active part 411 is greater than or equal to one tenth of the pitch L between the first electrode 5 and the second electrode 6. In the embodiment, the pitch $L_5$ between the first bottom surface 4111 and the second bottom surface 4112 of the first sub-active part 411 is equal to one sixth of the pitch L between the first electrode 5 and the second electrode 6.

The maximum distance $L_6$ between the side wall of the first sub-active part 411 and the side wall of the second active part 412 on the same side is greater than or equal to the pitch $L_5$ between the first bottom surface 4111 and the second bottom surface 4112 of the first sub-active part 411. In the embodiment, the maximum distance $L_6$ between the side wall of the first sub-active part 411 and the side wall of the second active part 412 on the same side is equal to the pitch $L_5$ between the first bottom surface 4111 and the second bottom surface 4112 of the first sub-active part 411. Therefore, a current distribution can be optimized, and the charge transmission is smoother, thereby reducing the crowding or aggregating effect of the charge at the corners.

A pitch $L_7$ between the third bottom surface 4121 and the fourth bottom surface 4122 of the second sub-active part 412 is less than or equal to one half of the pitch L ($L_1+L_3+L_5$) between the first electrode 5 and the second electrode 6, and the pitch $L_7$ between the third bottom surface 4121 and the fourth bottom surface 4122 of the second sub-active part 412 is greater than or equal to one tenth of the pitch L between the first electrode 5 and the second electrode 6. In the embodiment, the pitch $L_7$ between the third bottom surface 4121 and the fourth bottom surface 4122 of the second sub-active part 412 is equal to one sixth of the pitch L between the first electrode 5 and the second electrode 6.

The maximum distance La between the side wall of the second sub-active part 412 and the side wall of the third active part 43 on the same side is greater than or equal to the pitch $L_7$ between the third bottom surface 4121 and the fourth bottom surface 4122 of the second sub-active part 412. In the embodiment, the maximum distance La between the side wall of the second sub-active part 412 and the side wall of the third active part 43 on the same side is equal to the pitch $L_7$ between the third bottom surface 4121 and the fourth bottom surface 4122 of the second sub-active part 412. Therefore, a current distribution can be optimized, and the charge transmission is smoother, thereby reducing the crowding and aggregation effect of the charge at the corner.

EMBODIMENT 3

Figure 7:
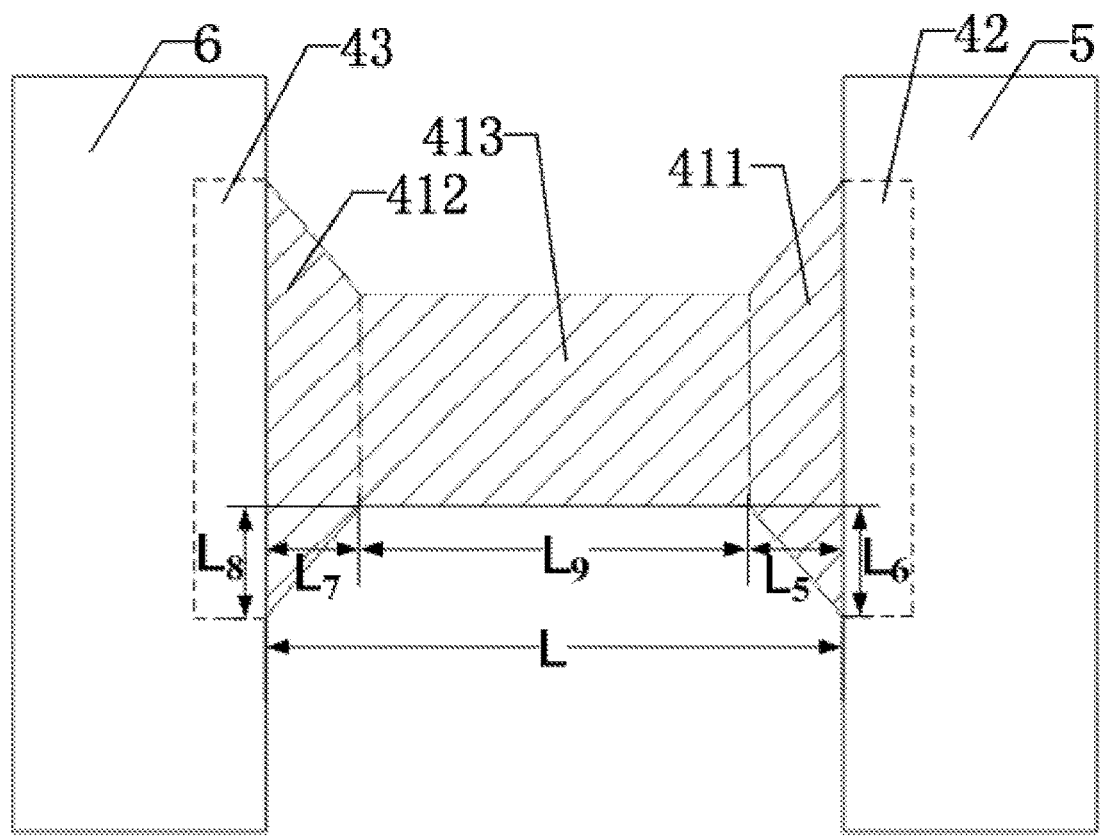
FIG. 7 is a top view of an active layer, a first electrode, and a second electrode of an array substrate according to a third embodiment of the present disclosure.
Figure 8:
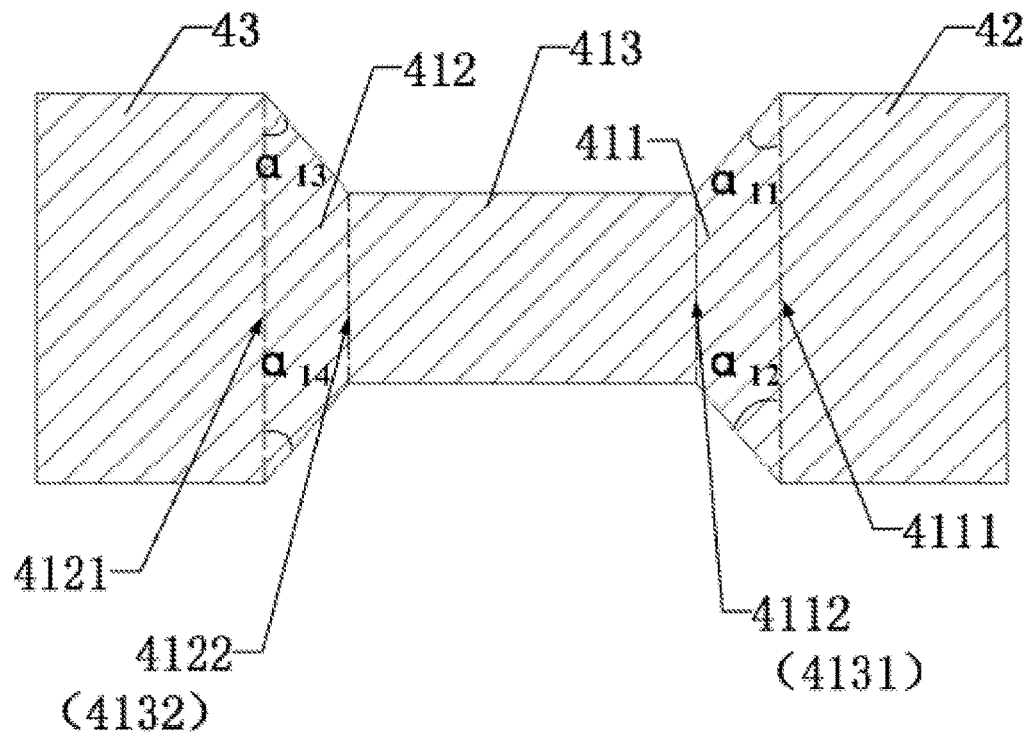
FIG. 8 is a top view of an active layer of an array substrate according to the third embodiment of the present disclosure.

As shown in FIGS. 7 and 8, the present embodiment includes most of the technical features of the second embodiment. The present embodiment differs from the second embodiment in that the shapes of the orthographic projections of the two sidewalls of the first sub-active part 411 on the substrate 1 are both the straight lines in the present embodiment. The shapes of the orthographic projections of the two sidewalls of the second sub-active part 412 on the substrate 1 are both the straight lines.

Angles $\alpha_{11}$ and $\alpha_{12}$ between the two sidewalls of the first sub-active part 411 and the first bottom surface 4111 are both acute angles, and the width of the first bottom surface 4111 of the first sub-active part 411 is larger than the width of the second bottom surface 4112 of the first sub-active part 411. In the embodiment, the shapes of the orthographic projections of the two sidewalls of the first sub-active part 411 on the substrate 1 are both the straight lines. Specifically, an angle $\alpha n$ between one side wall of the first sub-active part 411 and the first bottom surface 4111 is an acute angle. An angle $\alpha_{12}$ between the other side wall of the first sub-active part 411 and the first bottom surface 4111 is an acute angle. In this way, a signal passes through a corner of $180°+\alpha_{11}$ or $180°+\alpha_{12}$ in the process of flowing the signal from the first electrode 5 to the active layer 4. Since $\alpha_{11}$ and $\alpha_{12}$ are both acute angles, $180°+\alpha_{11}$ is less than 270° and $180°+\alpha_{12}$ is less than 270°. As a result, the angle of the corner experienced by the signal transmitted from the first electrode 5 to the second electrode 6 via the active layer 4 is reduced. Therefore, a current distribution is optimized, and charge transmission is smoother, thereby reducing the crowding and aggregating effect of the charge at the corner. Moreover, a resistance at the corner is reduced, and the generated heat is reduced under the condition that the current is not changed, so that the probability of burning the thin film transistor is reduced, finally improving service life of the display panel and reliability of the display panel.

Angles between the two side walls of the second sub-active part 412 and the third bottom surface 4121 are both acute angles. A width of the third bottom surface 4121 of the second sub-active part 412 is greater than a width of the fourth bottom surface 4122 of the second sub-active part 412. In the embodiment, the shapes of the orthographic projections of the two sidewalls of the second sub-active part 412 on the substrate 1 are both the straight lines. Specifically, an angle $\alpha_{13}$ between one side wall of the second sub-active part 412 and the third bottom surface 4121 is an acute angle. An angle $\alpha_{14}$ between the other side wall of the second sub-active part 412 and the third bottom surface 4121 is an acute angle. In this way, a signal passes through a corner of $180°+\alpha_{13}$ or $180°+\alpha_{14}$ in the process of flowing the signal from the first electrode 5 to the second electrode 6 through the active layer 4. Since $\alpha_{13}$ and $\alpha_{14}$ are both acute angles, $180°+\alpha_{13}$ is less than $270°$ and $180°+\alpha_{14}$ is less than $270°$. As a result, the angle of the corner experienced by the signal transmitted from the first electrode 5 to the second electrode 6 via the active layer 4 is further reduced. Therefore, a current distribution is optimized, and charge transmission is smoother, thereby reducing the crowding and aggregation effect of the charge at the corner. Moreover, a resistance at the corner is reduced, and the generated heat is reduced under the condition that the current is not changed, so that the probability of burning the thin film transistor is reduced, finally improving service life of the display panel and reliability of the display panel.

The array substrate and the display panel provided in the present disclosure are described in detail above. Specific embodiments are used herein to describe a principle and an implementation of the present disclosure. The description of the foregoing embodiments is merely used to help understand a method and a core idea of the present disclosure. In addition, a person skilled in the art may make changes in a specific implementation manner and an application scope according to an idea of the present disclosure. In conclusion, content of this specification should not be construed as a limitation on the present disclosure.

What is claimed is:

1. An array substrate, comprising:
   a substrate;
   an active layer disposed on the substrate and including a first active part and second and third active parts connected to opposite ends of the first active part, respectively;
   a first electrode covering the second active part and electrically connected to the second active part; and
   a second electrode covering the third active part and electrically connected to the third active part;
   wherein an orthographic projection of the first active part on the substrate is located between an orthographic projection of the first electrode on the substrate and an orthographic projection of the second electrode on the substrate, the first active part includes a first sub-active part and a second sub-active part, wherein the first sub-active part is connected between the second active part and the second sub-active part, the second sub-active part is connected between the first sub-active part and the third active part; and angles between two side walls of the first sub-active part and a first bottom surface of a side of the first sub-active part close to the second active part are both acute angles,
   wherein angles between two side walls of the second sub-active part and a third bottom surface of a side of the second sub-active part close to the third active part are both acute angles, and
   wherein a width of the first bottom surface of the first sub-active part is greater than a width of the second bottom surface of a side of the first sub-active part away from the second sub-active part, and a width of the third bottom surface of the second sub-active part is greater than a width of a fourth bottom surface of a side of the second sub-active part away from the third active par.

2. The array substrate of claim 1, wherein a pitch between the first bottom surface and the second bottom surface of the first sub-active part is less than or equal to one half of a pitch between the first electrode and the second electrode, and the pitch between the first bottom surface of the first sub-active part and the second bottom surface of the first sub-active part is greater than or equal to one tenth of the pitch between the first electrode and the second electrode.

3. The array substrate of claim 1, wherein a pitch between the third bottom surface and the fourth bottom surface of the second sub-active part is less than or equal to one half of the pitch between the first electrode and the second electrode, and the pitch between the third bottom surface and the fourth bottom surface of the second sub-active part is greater than or equal to one tenth of the pitch between the first electrode and the second electrode.

4. The array substrate of claim 1, wherein the maximum distance between a side wall of the first sub-active part and a side wall of the second active part on the same side is greater than or equal to a pitch between the first bottom surface and the second bottom surface of the first sub-active part; and
   the maximum distance between a side wall of the second sub-active part and a side wall of the third active part on the same side is greater than or equal to a pitch between the third bottom surface and the fourth bottom surface of the second sub-active part.

5. The array substrate of claim 1, wherein the first active part further includes a third sub-active part connected between the first sub-active part and the second sub-active part.

6. The array substrate of claim 5, wherein a pitch between a fifth bottom surface of a side of the third sub-active part close to the first sub-active part and a sixth bottom surface of a side of the third sub-active part away from the first sub-active part is greater than or equal to 1 µm.

7. The array substrate of claim 6, wherein the pitch between the fifth bottom surface of the third sub-active part and the sixth bottom surface of the third sub-active part is greater than or equal to a pitch between the first bottom surface and the second bottom surface of the first sub-active part; and
   the pitch between the fifth bottom surface of the third sub-active part and the sixth bottom surface of the third sub-active part is greater than or equal to a pitch between the third bottom surface and the fourth bottom surface of the second sub-active part.

8. The array substrate of claim 1, wherein shapes of the orthographic projections of the sidewalls of the first sub-active part on the substrate include one or more of a straight line and an arc line; and
   shapes of the orthographic projections of the sidewalls of the second sub-active part on the substrate include one or more of the straight line and the arc line.

9. A display panel, comprising an array substrate; the array substrate comprises:
   a substrate;
   an active layer disposed on the substrate and including a first active part and second and third active parts connected to opposite ends of the first active part, respectively;
   a first electrode covering the second active part and electrically connected to the second active part; and a second electrode covering the third active part and
electrically connected to the third active part;
wherein an orthographic projection of the first active part
on the substrate is located between an orthographic
projection of the first electrode on the substrate and an
orthographic projection of the second electrode on the
substrate, the first active part includes a first sub-active
part and a second sub-active part, wherein the first
sub-active part is connected between the second active
part and the second sub-active part, the second sub-
active part is connected between the first sub-active
part and the third active part; and angles between two
side walls of the first sub-active part and a first bottom
surface of a side of the first sub-active part close to the
second active part are both acute angles,
wherein angles between two side walls of the second
sub-active part and a third bottom surface of a side of
the second sub-active part close to the third active part
are both acute angles, and
wherein a width of the first bottom surface of the first
sub-active part is greater than a width of the second
bottom surface of a side of the first sub-active part away
from the second sub-active part, and a width of the third
bottom surface of the second sub-active part is greater
than a width of a fourth bottom surface of a side of the
second sub-active part away from the third active par.

10. The display panel of claim 9, wherein a pitch between
the first bottom surface and the second bottom surface of the
first sub-active part is less than or equal to one half of a pitch
between the first electrode and the second electrode, and the
pitch between the first bottom surface of the first sub-active
part and the second bottom surface of the first sub-active part
is greater than or equal to one tenth of the pitch between the
first electrode and the second electrode.

11. The display panel of claim 9, wherein a pitch between
the third bottom surface and the fourth bottom surface of the
second sub-active part is less than or equal to one half of the
pitch between the first electrode and the second electrode,
and the pitch between the third bottom surface and the fourth
bottom surface of the second sub-active part is greater than
or equal to one tenth of the pitch between the first electrode
and the second electrode.

12. The display panel of claim 9, wherein the maximum
distance between a side wall of the first sub-active part and
a side wall of the second active part on the same side is
greater than or equal to a pitch between the first bottom
surface and the second bottom surface of the first sub-active
part; and
the maximum distance between a side wall of the second
sub-active part and a side wall of the third active part
on the same side is greater than or equal to a pitch
between the third bottom surface and the fourth bottom
surface of the second sub-active part.

13. The display panel of claim 9, wherein the first active
part further includes a third sub-active part connected
between the first sub-active part and the second sub-active
part.

14. The display panel of claim 13, wherein a pitch
between a fifth bottom surface of a side of the third sub-
active part close to the first sub-active part and a sixth
bottom surface of a side of the third sub-active part away
from the first sub-active part is greater than or equal to 1 µm.

15. The display panel of claim 14, wherein the pitch
between the fifth bottom surface of the third sub-active part
and the sixth bottom surface of the third sub-active part is
greater than or equal to a pitch between the first bottom
surface and the second bottom surface of the first sub-active
part; and
the pitch between the fifth bottom surface of the third
sub-active part and the sixth bottom surface of the third
sub-active part is greater than or equal to a pitch
between the third bottom surface and the fourth bottom
surface of the second sub-active part.

16. The display panel of claim 9, wherein shapes of the
orthographic projections of the sidewalls of the first sub-
active part on the substrate include one or more of a straight
line and an arc line; and
shapes of the orthographic projections of the sidewalls of
the second sub-active part on the substrate include one
or more of the straight line and the arc line.

17. An array substrate, comprising:
a substrate;
a substrate;
an active layer disposed on the substrate and including a
first active part and second and third active parts
connected to opposite ends of the first active part,
respectively;
a first electrode covering the second active part and
electrically connected to the second active part; and
a second electrode covering the third active part and
electrically connected to the third active part;
wherein an orthographic projection of the first active part
on the substrate is located between an orthographic
projection of the first electrode on the substrate and an
orthographic projection of the second electrode on the
substrate, the first active part includes a first sub-active
part and a second sub-active part, wherein the first
sub-active part is connected between the second active
part and the second sub-active part, the second sub-
active part is connected between the first sub-active
part and the third active part; and angles between two
side walls of the first sub-active part and a first bottom
surface of a side of the first sub-active part close to the
second active part are both acute angles,
wherein angles between two side walls of the second
sub-active part and a third bottom surface of a side of
the second sub-active part close to the third active part
are both acute angles, and
wherein shapes of the orthographic projections of the
sidewalls of the first sub-active part on the substrate
include one or more of a straight line and an arc line,
and shapes of the orthographic projections of the side-
walls of the second sub-active part on the substrate
include one or more of the straight line and the arc line.

\* \* \* \* \*